(12) United States Patent
Guo et al.

(10) Patent No.: US 9,911,754 B1
(45) Date of Patent: Mar. 6, 2018

(54) 3D MEMORY STRUCTURE

(71) Applicant: MACRONIX International Co., Ltd., Hsinchu (TW)

(72) Inventors: Jung-Yi Guo, Hsinchu (TW); Chun-Min Cheng, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/288,799

(22) Filed: Oct. 7, 2016

(51) Int. Cl.
| | |
|---|---|
| *H01L 27/115* | (2017.01) |
| *H01L 27/11582* | (2017.01) |
| *H01L 21/02* | (2006.01) |
| *H01L 21/28* | (2006.01) |
| *H01L 21/768* | (2006.01) |
| *H01L 29/16* | (2006.01) |
| *H01L 29/04* | (2006.01) |
| *H01L 29/51* | (2006.01) |

(52) U.S. Cl.
CPC .. *H01L 27/11582* (2013.01); *H01L 21/02164* (2013.01); *H01L 21/02238* (2013.01); *H01L 21/02532* (2013.01); *H01L 21/02592* (2013.01); *H01L 21/02667* (2013.01); *H01L 21/28282* (2013.01); *H01L 21/76897* (2013.01); *H01L 29/04* (2013.01); *H01L 29/16* (2013.01); *H01L 29/513* (2013.01); *H01L 29/518* (2013.01)

(58) Field of Classification Search
None
See application file for complete search history.

(56) References Cited

U.S. PATENT DOCUMENTS

| | | | |
|---|---|---|---|
| 7,453,113 B2 | 11/2008 | Ouyang et al. | |
| 8,916,924 B2 | 12/2014 | Chen | |
| 9,287,290 B1 * | 3/2016 | Rabkin | H01L 27/11582 |
| 2003/0136978 A1 | 7/2003 | Takaura et al. | |
| 2004/0157353 A1 * | 8/2004 | Ouyang | H01L 29/1054 438/38 |
| 2014/0217491 A1 * | 8/2014 | Lee | G11C 16/3427 257/321 |
| 2015/0076586 A1 * | 3/2015 | Rabkin | G11C 16/0483 257/324 |
| 2016/0149004 A1 * | 5/2016 | Rabkin | H01L 21/28282 257/43 |
| 2016/0315095 A1 * | 10/2016 | Sel | H01L 29/04 |
| 2017/0084623 A1 * | 3/2017 | Sharangpani | H01L 27/11556 |

* cited by examiner

*Primary Examiner* — Thao P Le
(74) *Attorney, Agent, or Firm* — J.C. Patents

(57) ABSTRACT

A process for fabricating a 3D memory is shown. Linear stacks, each of which includes alternately stacked gate lines and insulating layers, are formed. A charge trapping layer is formed covering the linear stacks. An amorphous semiconductor layer is formed on the charge trapping layer. An ultra-thin cap layer is formed on the amorphous semiconductor layer. The amorphous semiconductor layer is annealed to form a crystalline channel layer, wherein agglomeration of the material of the amorphous semiconductor layer is suppressed by then ultra-thin cap layer.

7 Claims, 4 Drawing Sheets

3D MEMORY STRUCTURE

BACKGROUND OF THE INVENTION

Field of Invention

This invention relates to an integrated circuit (IC) process, and particularly relates to a process for fabricating a three-dimensional (3D) memory, and to a structure of a 3D memory of which the fabrication includes the same process.

Description of Related Art

As the demand for storage subsystems of electronic products is increased, the standard for the read/write speeds or capacities of products is higher, so high-capacity related products have become the mainstream in the industry. Therefore, 3D memory, especially 3D vertical-gate (VG) NAND flash memory, has been developed recently.

In a conventional vertical-gate 3D memory process, a plurality of linear stacks each including alternately stacked gate lines and insulating layers are formed, a thin amorphous silicon layer is formed and then annealed to form a thin polysilicon channel layer, and then contact plugs are formed on the channel layer above the linear stacks.

However, because agglomeration easily occurs on the silicon layer in the annealing, portions of the channel layer on opposite sidewalls of the linear stacks may be connected by the agglomeration to cause short circuits, especially when the process linewidth is small.

Moreover, since the polysilicon channel layer is thin, the contact plugs are difficult to land on the channel layer above the linear stacks.

SUMMARY OF THE INVENTION

Accordingly, this invention provides a process for fabricating a 3D memory, which is capable of suppressing agglomeration in the crystallization annealing, and may also allow the contact plugs to easily land on the channel layer.

This invention also provides a 3D memory of which the fabrication includes the above process of this invention.

The process for fabricating a 3D memory of this invention comprises the following steps. A plurality of linear stacks, each of which includes a plurality of gate lines and a plurality of insulating layers that are stacked alternately, is formed. A charge trapping layer is formed covering the linear stacks. An amorphous semiconductor layer is formed on the charge trapping layer. A cap layer is formed on the amorphous semiconductor layer. The amorphous semiconductor layer is annealed to form a crystalline channel layer, wherein agglomeration of the material of the amorphous semiconductor layer is suppressed by the cap layer.

In an embodiment of the above process, the amorphous semiconductor layer comprises: top portions above the linear stacks and having a first thickness, sidewall portions on sidewalls of the linear stacks and having a second thickness, and bottom portions between the linear stacks and having a third thickness, wherein the first thickness is larger than the second thickness and the third thickness.

The 3D memory of this invention comprises the aforementioned plurality of linear stacks, a charge trapping layer covering the linear stacks, a crystalline channel layer on the charge trapping layer, a cap layer on the crystalline channel layer, and a plurality of contact plugs disposed on top portions of the crystalline channel layer above the linear stacks through the cap layer. The crystalline channel layer comprises: top portions above the linear stacks and having a first thickness, sidewall portions on side walls of the linear stacks and having a second thickness, and bottom portions between the linear stacks and having a third thickness, wherein the first thickness is larger than the second thickness and the third thickness.

In an embodiment of this invention, the 3D memory further comprises a re-oxidation layer between the crystalline channel layer and the cap layer.

Since the cap layer is formed on the amorphous semiconductor layer to suppress agglomeration in the subsequent annealing, the quality of the resulting crystalline channel layer can be improved. Moreover, in the case that the thickness of the top portions of the amorphous semiconductor layer is larger than those of the other portions, contact plugs are easier to land on the channel layer above the linear stacks.

In order to make the aforementioned and other objects, features and advantages of this invention comprehensible, a preferred embodiment accompanied with figures is described in detail below.

DESCRIPTION OF EMBODIMENTS

This invention is further explained with the following embodiments, which are not intended to limit the scope thereof. For example, although the crystalline channel layer is thinned by re-oxidation through the cap layer after being formed in the embodiment, the thinning/re-oxidation step may be omitted if the amorphous layer as the precursor of the crystalline channel layer is formed sufficiently thin.

Figure 1A:
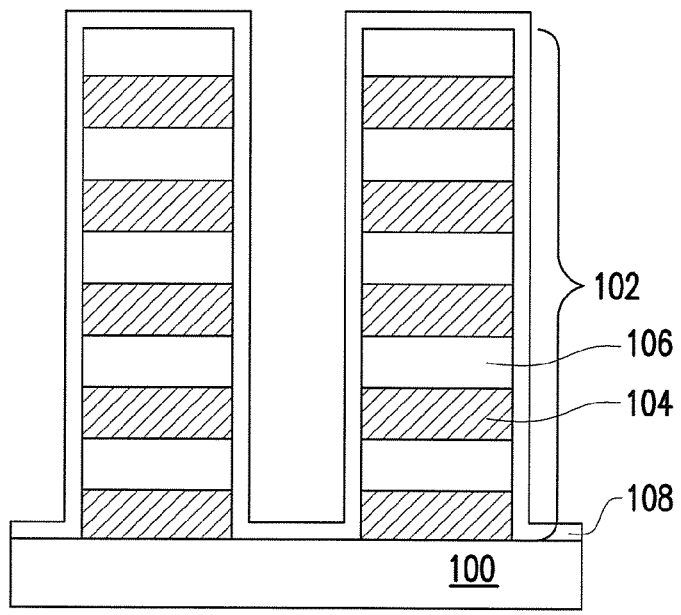
FIGS. 1A to 1E illustrate, in a cross-sectional view, a process for fabricating a 3D memory according to an embodiment of this invention, wherein FIG. 1E also illustrates a structure of the 3D memory according to the embodiment of this invention.
Figure 1B:
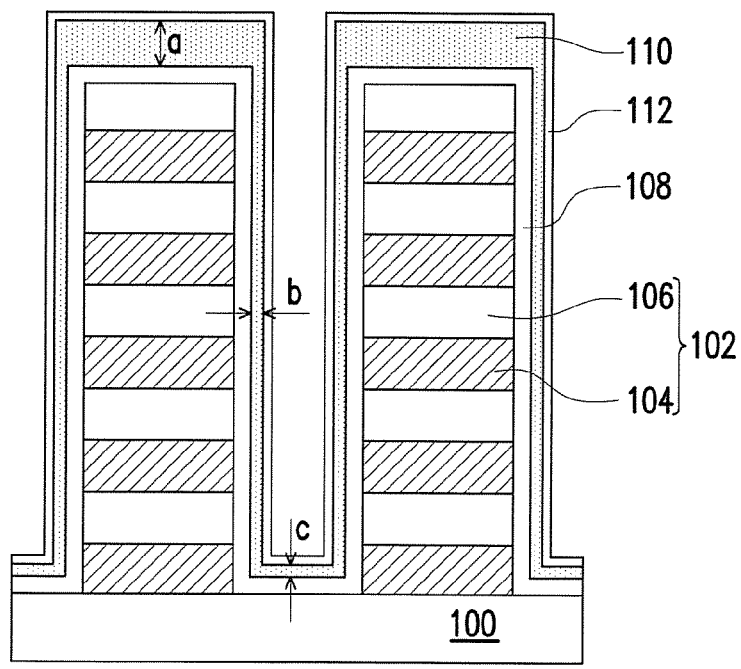
Figure 1C:
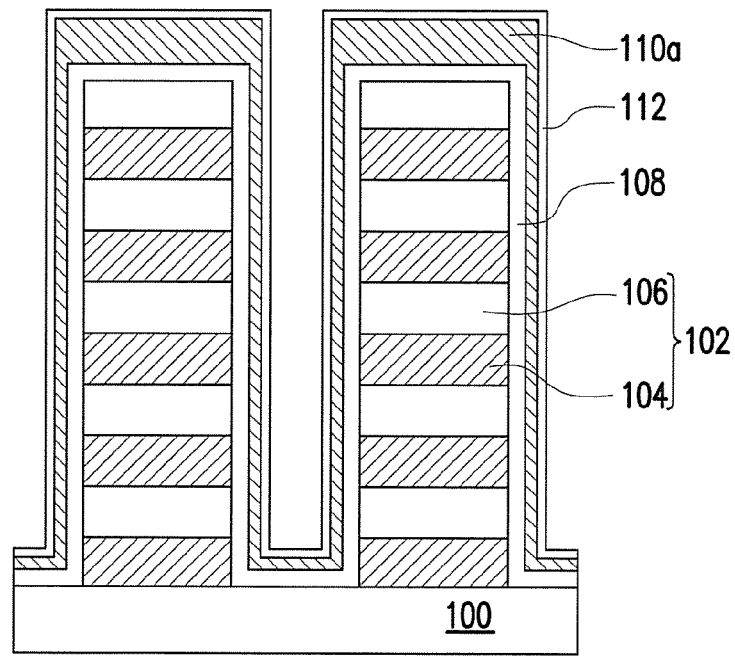
Figure 1D:
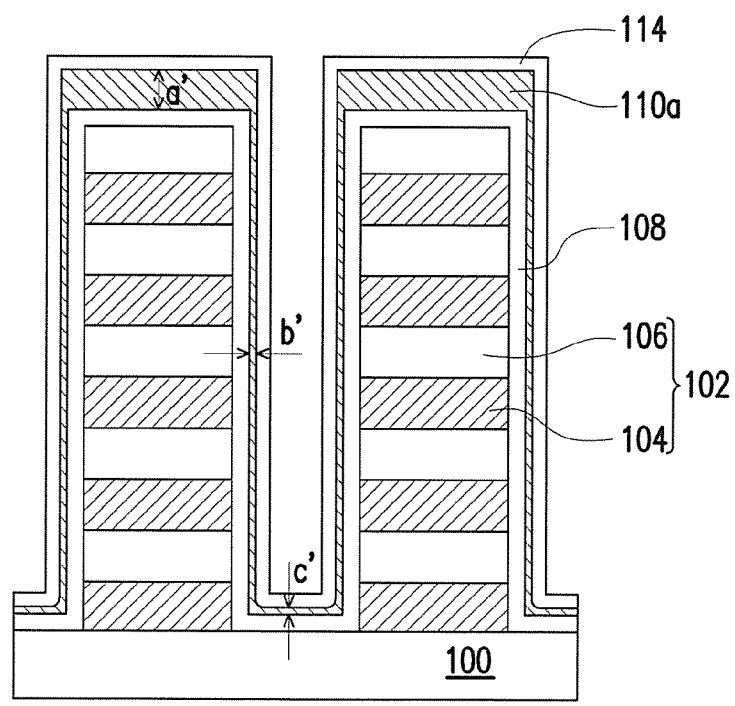
Figure 1E:
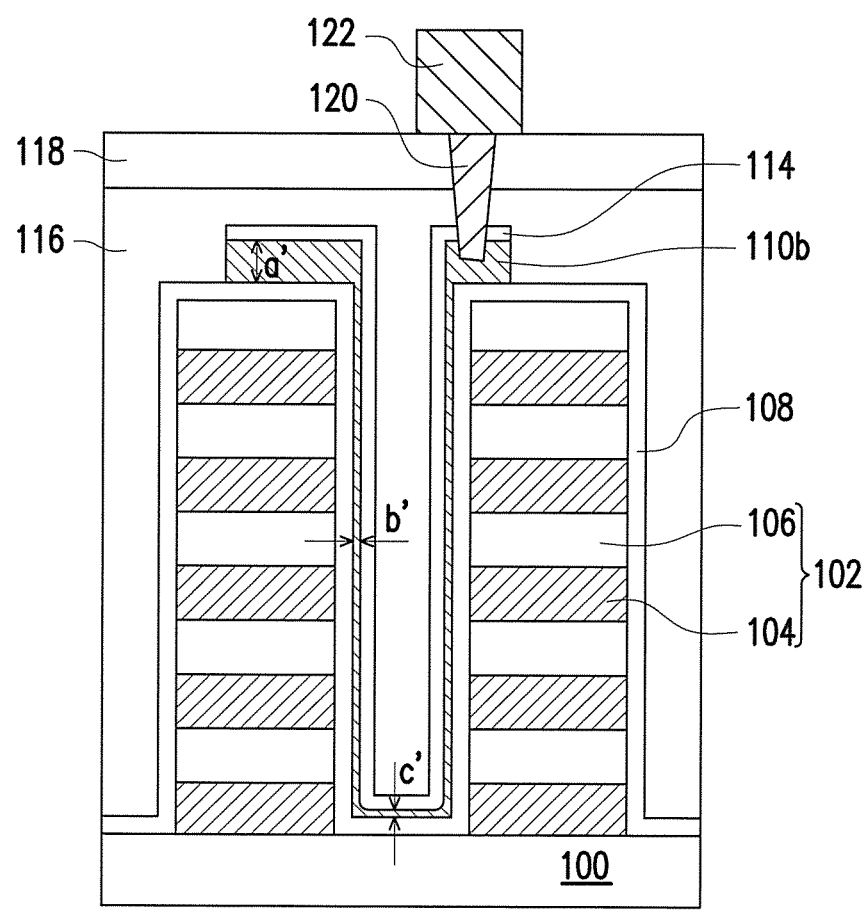

FIGS. 1A to 1E illustrate, in a cross-sectional view, a process for fabricating a 3D memory according to an embodiment of this invention, wherein FIG. 1E also illustrates a structure of the 3D memory according to the embodiment of this invention.

Referring to FIG. 1A, on a substrate 100, a plurality of linear stacks 102 is formed, each of which comprises a plurality of gate lines 104 and a plurality of insulating layers 106 that are stacked alternately. The gate lines 104 may include, for example, doped polysilicon or a metallic material, wherein the metallic material may be tungsten (W) or TiN, etc. The insulating layers 106 may include, for example, $SiO_2$ or $Si_3N_4$, etc. The linear stacks 102 may be formed by forming a plurality of blanket conductive layers and a plurality of blanket insulating layers alternately and then patterning the resulting multi-layer stack.

Then, a charge trapping layer 108 is formed covering the linear stacks 102. The charge trapping layer 108 includes, for example, an ONO composite layer, which typically includes a bottom silicon oxide layer, a silicon nitride (SiN) layer having trapping sites on the bottom silicon oxide layer, and a top silicon oxide layer on the SiN layer. The charge trapping layer 108 may alternatively include bandgap-engineered SONOS (BE-SONOS), etc.

Referring to FIG. 1B, an amorphous semiconductor layer 110 is formed on the charge trapping layer 108. The amorphous semiconductor layer 110 may have a uniform thickness at all portions thereof, or may alternatively have a larger thickness at the top portions thereof so that in the subsequent process, contact plugs are easier to land on the top of the channel layer formed from the amorphous semiconductor layer 110. In the latter case, specifically, the amorphous semiconductor layer 110 comprises: top portions above the linear stacks 102 and having a first thickness "a," sidewall portions on the sidewalls of the linear stacks 102 and having a second thickness "b," and bottom portions between the linear stacks 102 and having a third thickness "c," wherein the first thickness a is larger than the second thickness b and the third thickness c. The thickness a of the top portions of the amorphous semiconductor layer 110 may be within the range of 150 to 300 angstroms. It is possible that the ratio of the first thickness a to the second thickness b ranges from 1.5 to 2.5, and the ratio of the first thickness a to the third thickness c ranges from 1.5 to 3.0.

The amorphous semiconductor layer 110 may include amorphous silicon or silicon-germanium (SiGe), etc. In a case where the amorphous semiconductor layer 110 is to be formed by amorphous silicon with a larger thickness at the top portions thereof, it is possible to perform a CVD process in which $Si_2H_6$ as a silicon source is supplied at a flow rate of 50 to 200 sccm, the temperature is set in the range of 400° C. to 550° C., and the pressure is set in the range of 100 to 250 torr. $Si_2H_6$ may be replaced by $SiH_4$, $Si_3H_8$ or other Si-based precursor.

Then, an ultra-thin cap layer 112 is formed on the amorphous semiconductor layer 110. In a case where the amorphous semiconductor layer 110 includes amorphous silicon, the cap layer 112 may include a silicon oxide layer having a thickness of 10 to 20 angstroms. The ultra-thin cap layer 112 may be formed with a deposition process, a re-oxidation process or a wet treatment. The wet treatment may include, for example, treating the amorphous silicon layer with ozone in deionized water, which also removes the surface contamination. This is helpful to suppress agglomeration issue.

Referring to FIG. 1C, the amorphous semiconductor layer 110 is annealed to form a crystalline channel layer 110a, wherein agglomeration of the material of the amorphous semiconductor layer 110 is suppressed by the cap layer 112. For example, in a case where the amorphous semiconductor layer 110 includes amorphous silicon, agglomeration of silicon on the amorphous semiconductor layer 110 is suppressed by the ultra-thin silicon oxide layer as the cap layer 112 in the annealing. The annealing temperature may be set in the range of 900° C. to 1100° C., and the annealing time may be set in the range of 25 min to 35 min.

Referring to FIG. 1D, after the crystalline channel layer 110a is formed, the crystalline channel layer 110a is thinned by re-oxidation through the cap layer 112. In a case where the amorphous semiconductor layer 110 includes amorphous silicon and the cap layer 112 includes silicon oxide, the re-oxidation layer merges with the cap layer 112 to form a thicker silicon oxide layer 114. The re-oxidation layer may have a thickness less than 150 angstroms. In addition, because the re-oxidation layer has a substantially uniform thickness, in a case where the amorphous semiconductor layer 110 has top portions, sidewall portions and bottom portions having the aforementioned thicknesses a, b and c (a>b, c), respectively, the top portions of the crystalline channel layer 110a after the re-oxidation layer also has a larger thickness a' than the thickness b' of the sidewall portions of the same and the thickness c' of the bottom sidewall portions of the same (a'>b', c'). The thickness a' of the top portions of the thinned channel layer 110a may be in the range of 100 to 250 angstroms.

The re-oxidation process may include, for example, dry oxidation, wet oxidation, radical oxidation, or in-situ steam oxidation. Device performances such as sub-threshold swing and Vt distribution can be further improved by the channel thinning process.

Referring to FIG. 1E, the crystalline channel layer 110a is patterned into a patterned channel layer 110b. The patterned channel layer 110b has sidewall portions on the sidewalls of the linear stacks 102 and bottom portions between the linear stacks 102 to form U-turn channel structures between the linear stacks 102. A sealing insulating layer 116 is formed filling the trenches between the linear stacks 102. An interlayer dielectric (ILD) layer 118 is formed over the sealing insulating layer 116 and the linear stacks 102. A plurality of contact plugs 120 is then formed on the top portions of the channel layer 110b, through the ILD layer 118, the sealing insulating layer 116 and the silicon oxide layer 114, and usually slightly extending into the channel layer 110b. Metal interconnect layers are then formed directly or indirectly connecting with the contact plugs 120, wherein only one metal interconnect layer 122 directly connecting with the contact plugs 120 is shown in the figure as an example.

The sealing insulating layer 116 may include, for example, spin-on glass (SOG). The ILD layer 118 may include, for example, PECVD oxide. In addition, the film quality of the capping silicon oxide layer 114 (i.e., ultra-thin $SiO_2$+re-oxidation $SiO_2$) is close to thermal oxide. Oxide stain-etching is one of the useful methods to distinguish the different oxide materials. Typically, the oxide stain etching uses diluted HF or diluted HF with $NH_4F$. Their etching rates depend on the densities thereof. The etching selectivity is around 1:5:2.

Figure 2:
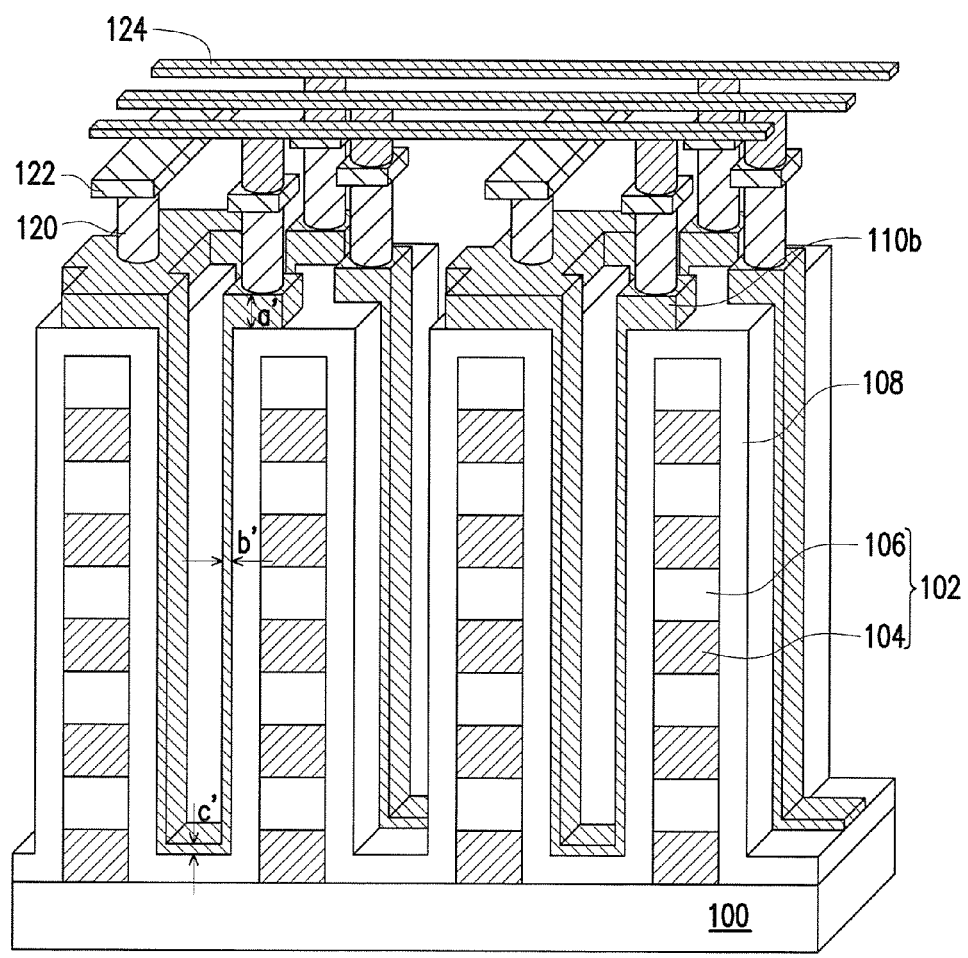
FIG. 2 illustrates, in a perspective view, a 3D memory having a cross-sectional view as shown in FIG. 1E according to an embodiment of this invention.

FIG. 2 illustrates, in a perspective view, a 3D memory having a cross-sectional view as shown in FIG. 1E according to an embodiment of this invention.

Referring to FIG. 2, the figure additionally shows an exemplary full layout of the patterned channel layer 110b with U-turn channel structures between the linear stacks 102, an exemplary layout of the contact plugs 120, exemplary respective layouts of the first metal interconnect layer 122 and the second metal interconnect layer 124 for row selection and column selection, and so forth.

Since the ultra-thin cap layer is formed on the amorphous semiconductor layer to suppress agglomeration in the subsequent annealing, the quality of the resulting crystalline channel layer can be improved. Moreover, in the above embodiment, since the thickness of the top portions of the amorphous semiconductor layer is larger than those of the other portions, contact plugs are easier to land on the channel layer above the linear stacks.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A 3D memory, comprising:
   a plurality of linear stacks, each of which comprises a plurality of gate lines and a plurality of insulating layers that are stacked alternately;
   a charge trapping layer covering the linear stacks;
   a crystalline channel layer on the charge trapping layer, comprising: top portions above the linear stacks and having a first thickness, sidewall portions on sidewalls of the linear stacks and having a second thickness, and bottom portions between the linear stacks and having a third thickness, wherein the first thickness is larger than the second thickness and the third thickness;

a cap layer on the crystalline channel layer; and a plurality of contact plugs disposed on the top portions of the crystalline channel layer through the cap layer.

2. The 3D memory of claim 1, wherein the sidewall portions and the bottom portions of the crystalline channel layer form U-turn channel structures between the linear stacks.

3. The 3D memory of claim 1, further comprising a re-oxidation layer between the crystalline channel layer and the cap layer.

4. The 3D memory of claim 1, wherein the crystalline channel layer comprises polysilicon, and the cap layer comprises a silicon oxide layer having a thickness of 10 to 20 angstroms.

5. The 3D memory of claim 4, wherein the silicon oxide layer is formed through treating the amorphous semiconductor layer with ozone in deionized water.

6. The 3D memory of claim 1, further comprising a sealing insulating layer filling trenches between the linear stacks; and an inter-layer dielectric (ILD) layer over the sealing insulating layer and the linear stacks, wherein the contact plugs extend through at least the ILD layer among the sealing insulating layer and the ILD layer.

7. The 3D memory of claim 1, wherein the charge trapping layer comprises an ONO composite layer.

* * * * *